(12) United States Patent
Meisner et al.

(10) Patent No.: US 8,466,569 B2
(45) Date of Patent: Jun. 18, 2013

(54) INCREASING EXPOSURE TOOL ALIGNMENT SIGNAL STRENGTH FOR A FERROELECTRIC CAPACITOR LAYER

(75) Inventors: Stephen Arlon Meisner, Allen, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/411,914

(22) Filed: Mar. 26, 2009

(65) Prior Publication Data

US 2009/0243123 A1    Oct. 1, 2009

Related U.S. Application Data

(60) Provisional application No. 61/041,361, filed on Apr. 1, 2008.

(51) Int. Cl.
| | |
|---|---|
| *H01L 23/544* | (2006.01) |
| *H01L 23/48* | (2006.01) |
| *H01L 23/52* | (2006.01) |
| *H01L 29/40* | (2006.01) |

(52) U.S. Cl.
USPC .......... 257/797; 257/764; 257/765; 257/771; 257/E23.178

(58) Field of Classification Search
USPC .............. 257/797, E23.178, 764, 765, 771
See application file for complete search history.

(56) References Cited

U.S. PATENT DOCUMENTS

| | | | | |
|---|---|---|---|---|
| 4,529,685 | A * | 7/1985 | Borodovsky | 430/311 |
| 5,969,428 | A * | 10/1999 | Nomura et al. | 257/797 |
| 5,985,764 | A * | 11/1999 | Lin et al. | 438/692 |
| 6,010,945 | A * | 1/2000 | Wu | 438/401 |
| 6,015,750 | A * | 1/2000 | Bruce et al. | 438/636 |
| 6,049,137 | A * | 4/2000 | Jang et al. | 257/797 |
| 6,271,602 | B1 * | 8/2001 | Ackmann et al. | 257/797 |
| 6,350,658 | B1 * | 2/2002 | Miraglia | 438/401 |
| 6,566,157 | B2 * | 5/2003 | Ohtaka | 438/48 |
| 6,720,667 | B2 * | 4/2004 | Kim | 257/797 |
| 6,753,617 | B2 * | 6/2004 | Stanton et al. | 257/797 |
| 6,774,452 | B1 * | 8/2004 | Ramkumar et al. | 257/506 |
| 7,100,263 | B2 * | 9/2006 | Imada et al. | 29/514 |
| 2003/0157779 | A1 * | 8/2003 | Diewald et al. | 438/401 |
| 2004/0227260 | A1 * | 11/2004 | Fukuzumi et al. | 257/797 |
| 2006/0024923 | A1 * | 2/2006 | Sarma et al. | 438/462 |
| 2007/0102819 | A1 * | 5/2007 | Goller et al. | 257/758 |
| 2007/0207298 | A1 * | 9/2007 | Suzuki et al. | 428/216 |

\* cited by examiner

*Primary Examiner* — Teresa M Arroyo
(74) *Attorney, Agent, or Firm* — Rose Alyssa Keagy; Wade J. Brady, III; Frederick J. Telecky, Jr.

(57) ABSTRACT

An improved alignment structure for photolithographic pattern alignment is disclosed. A topographical alignment mark in an IC under a low reflectivity layer may be difficult to register. A reflective layer is formed on top of the low reflectivity layer so that the topography of the alignment mark is replicated in the reflective layer, enabling registration of the alignment mark using common photolithographic scanners and steppers. The reflective layer may be one or more layers, and may be metallic, dielectric or both. The reflective layer may be global over the entire IC or may be local to the alignment mark area. The reflective layer may be removed during subsequent processing, possibly with assist from an added etch stop layer, or may remain in the completed IC. The disclosed alignment mark structure is applicable to an IC with a stack of ferroelectric capacitor materials.

8 Claims, 12 Drawing Sheets

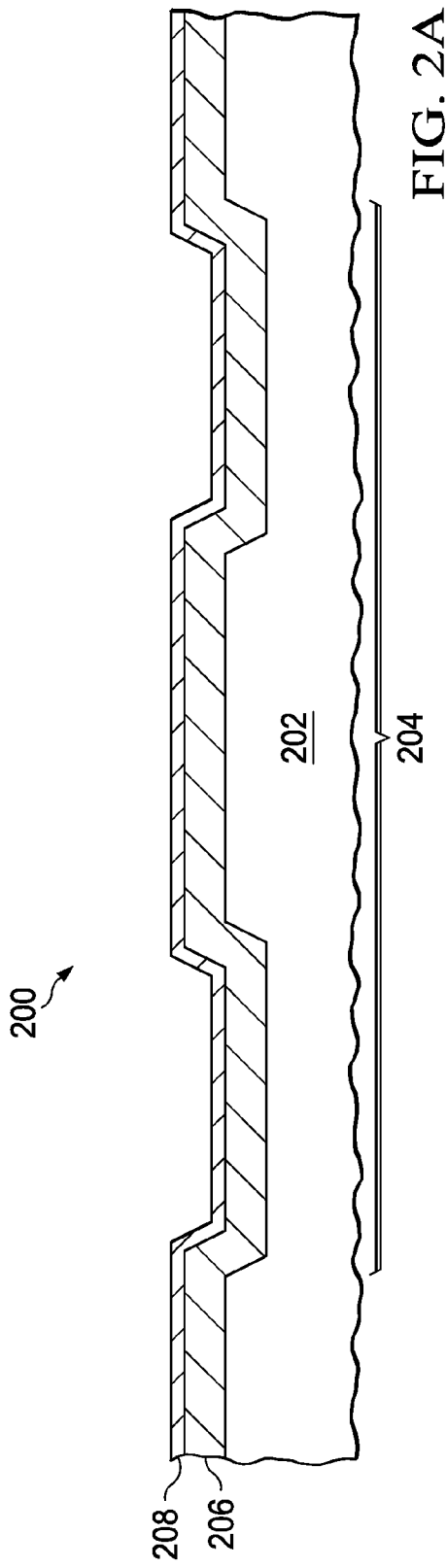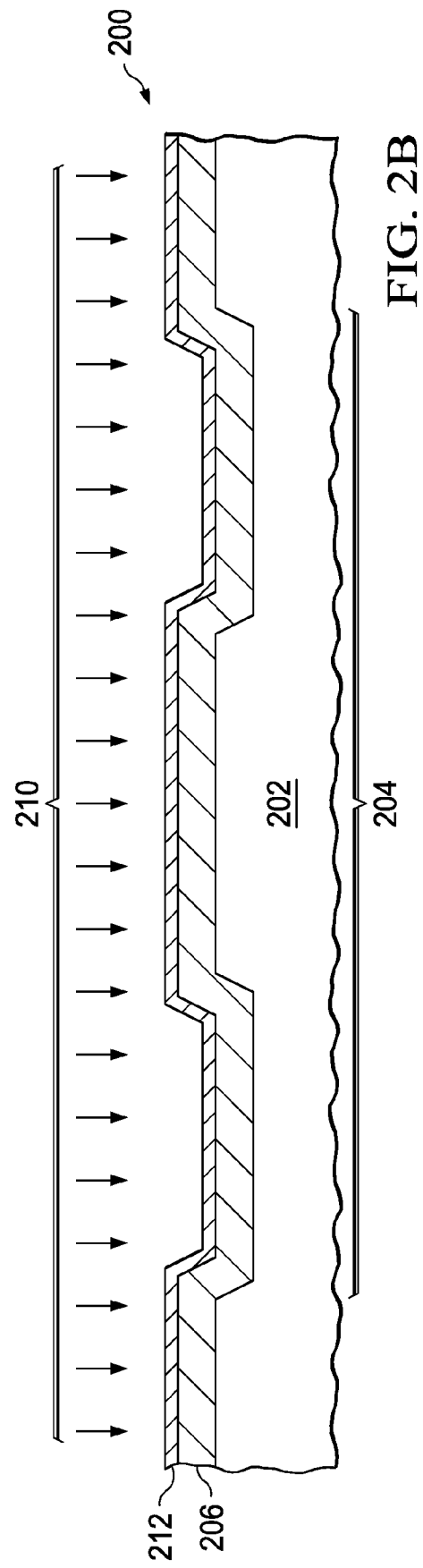

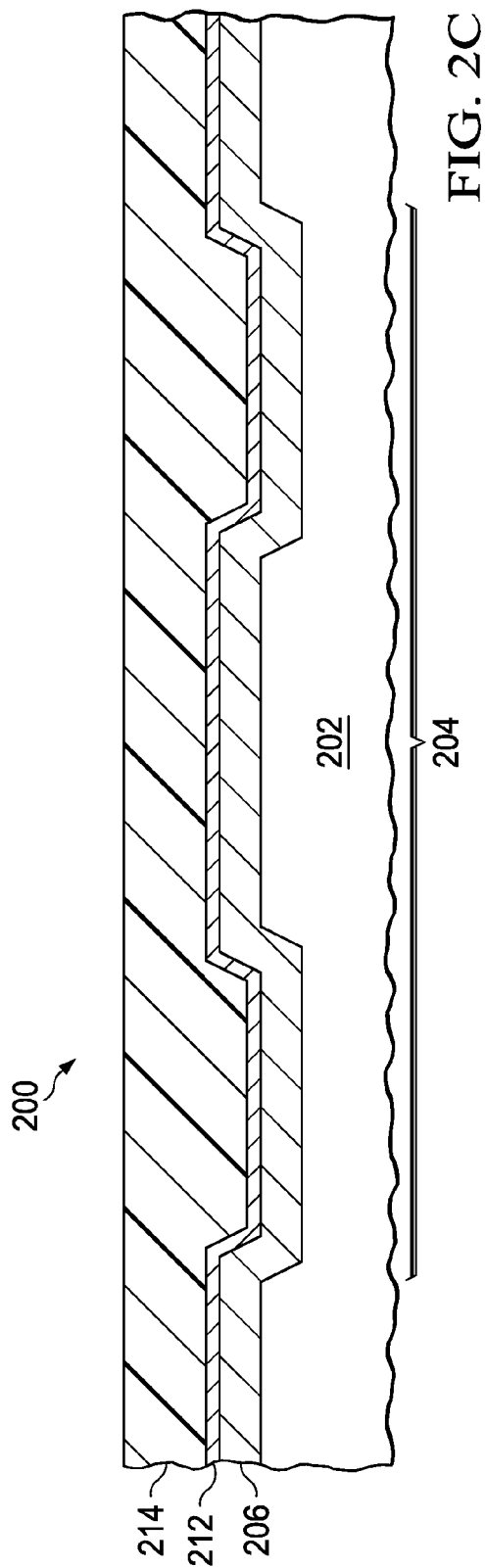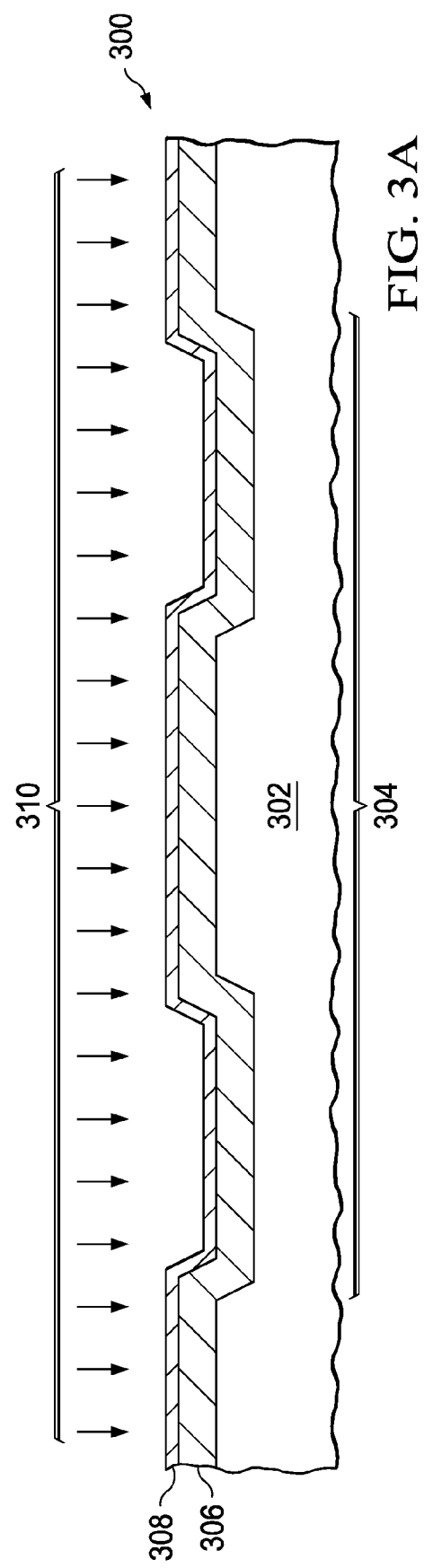

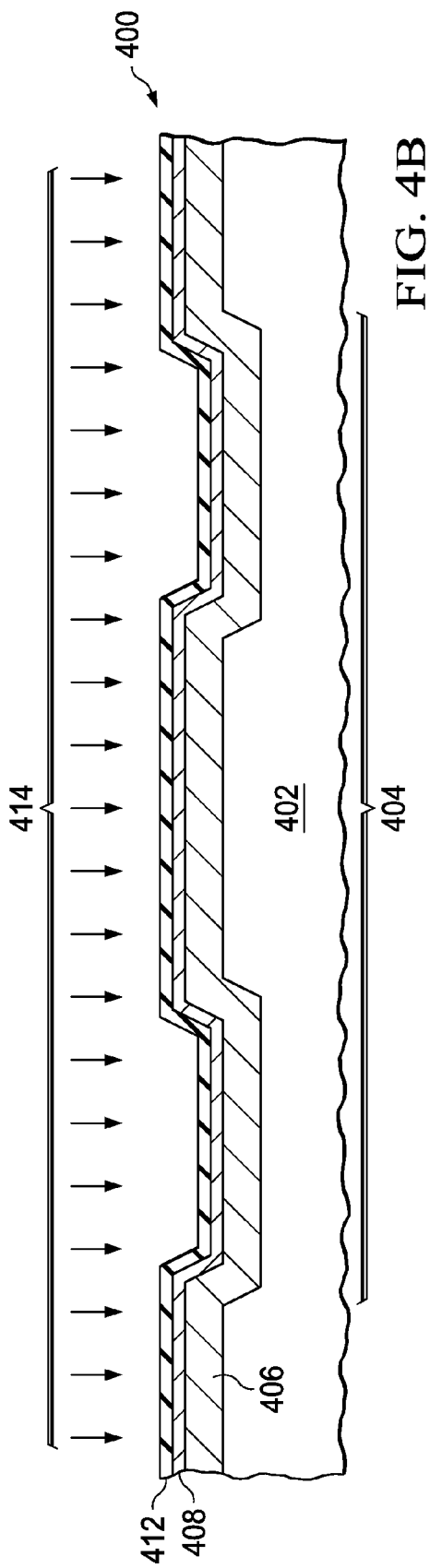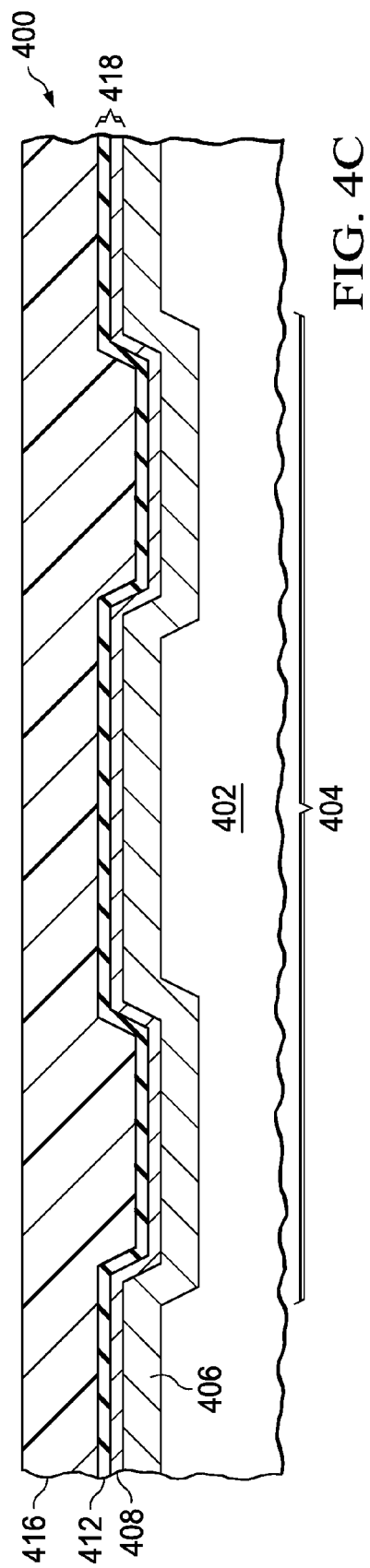

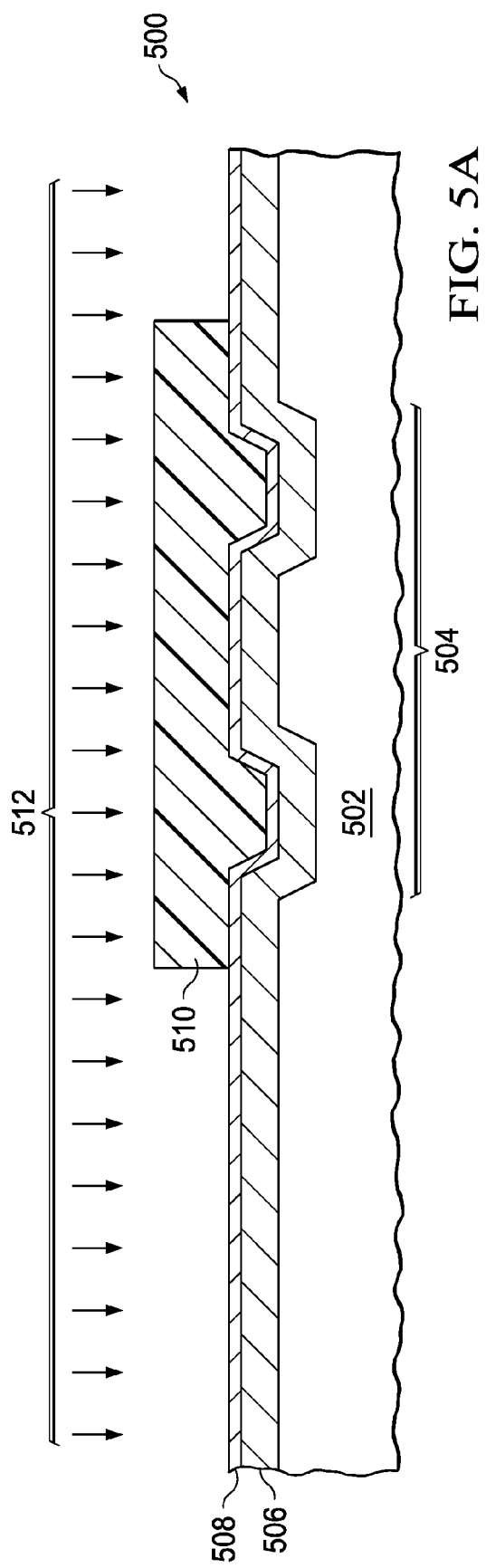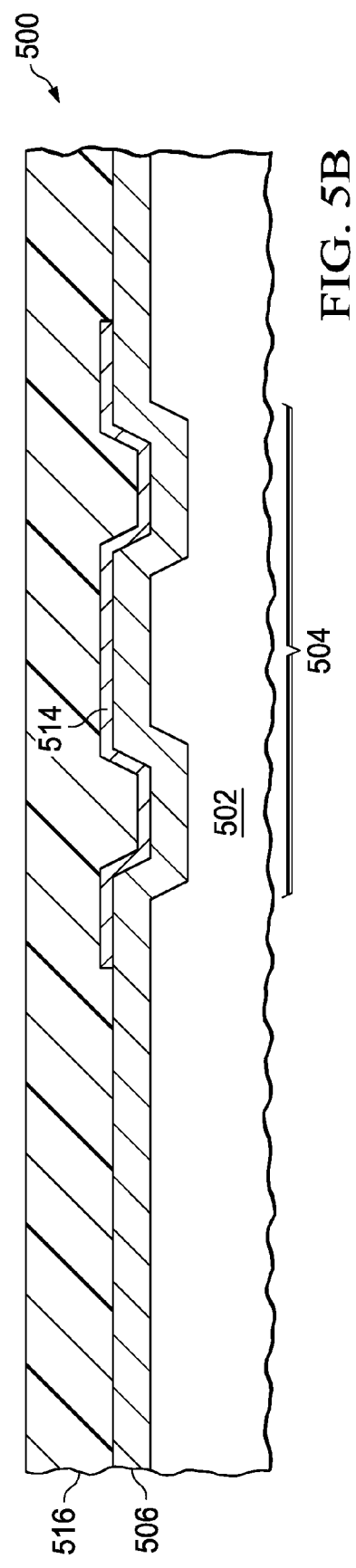

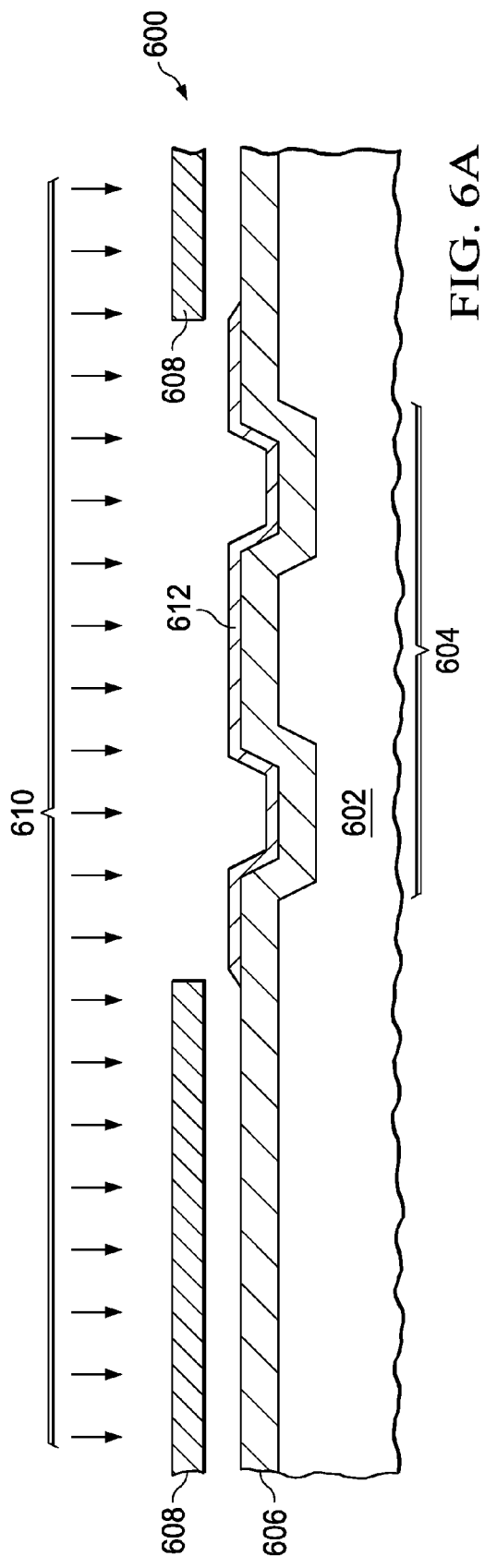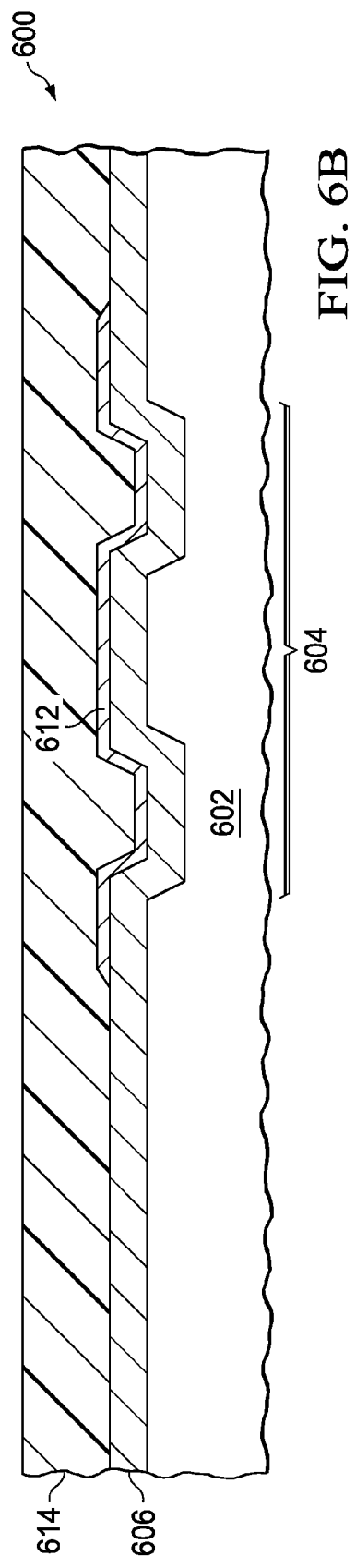

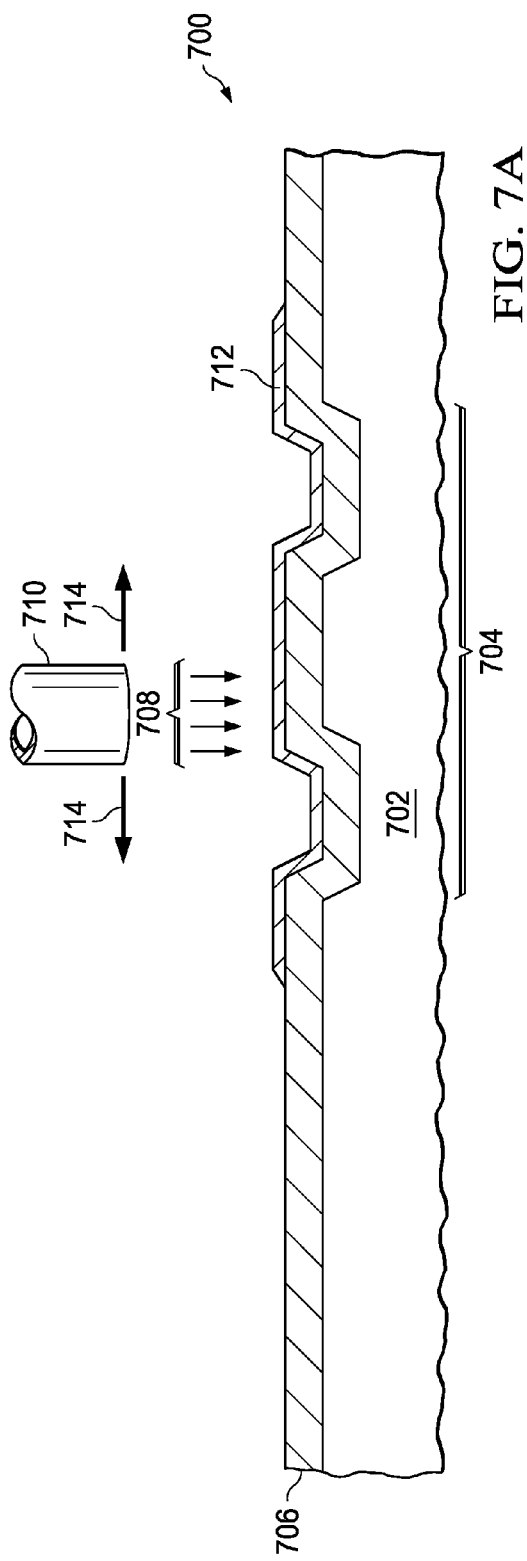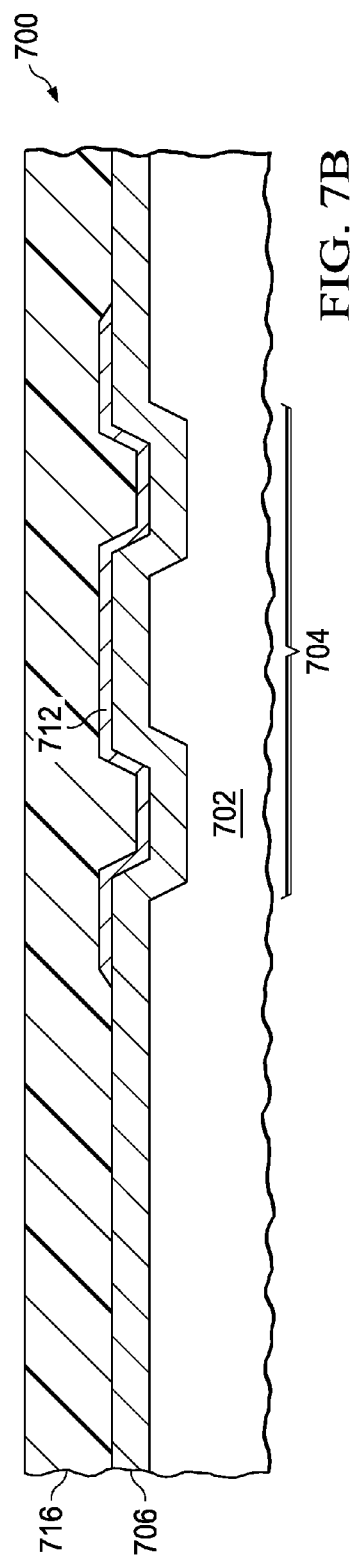

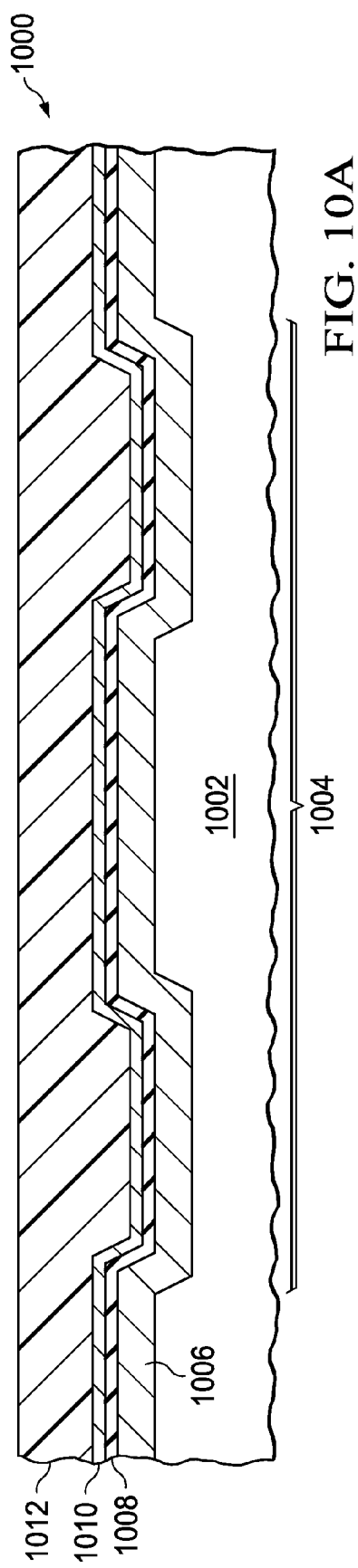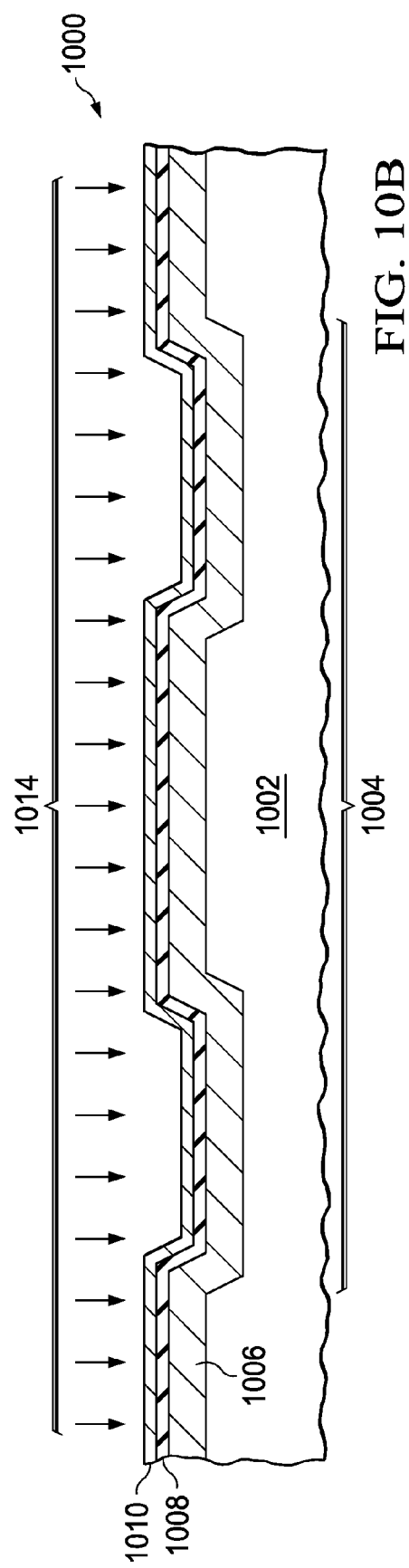

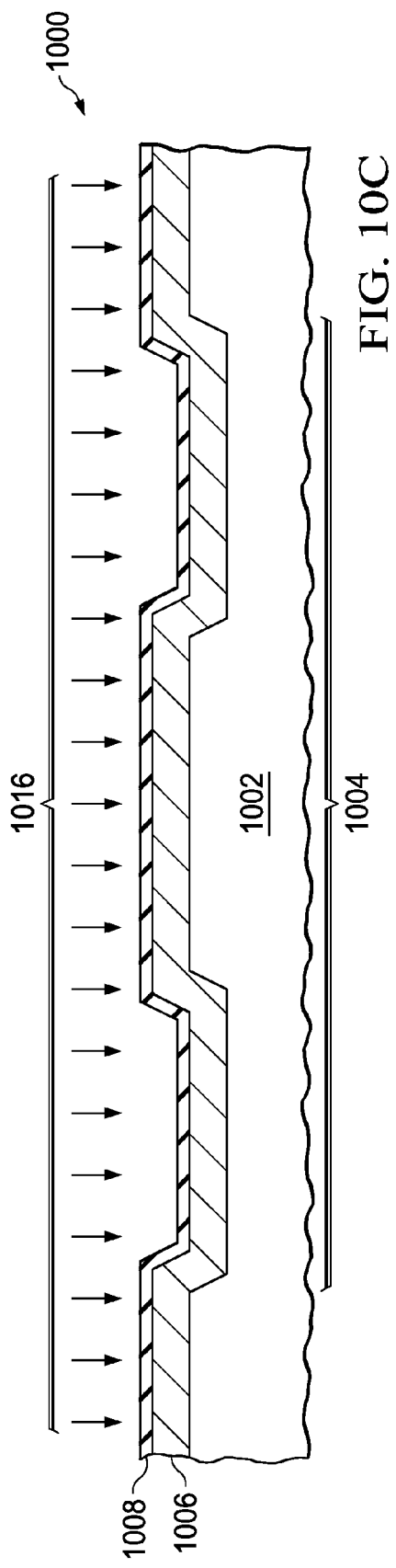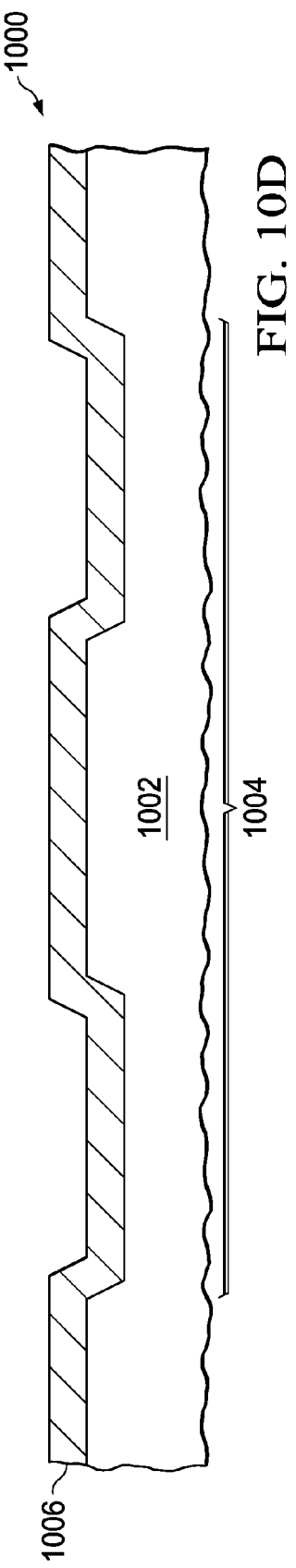

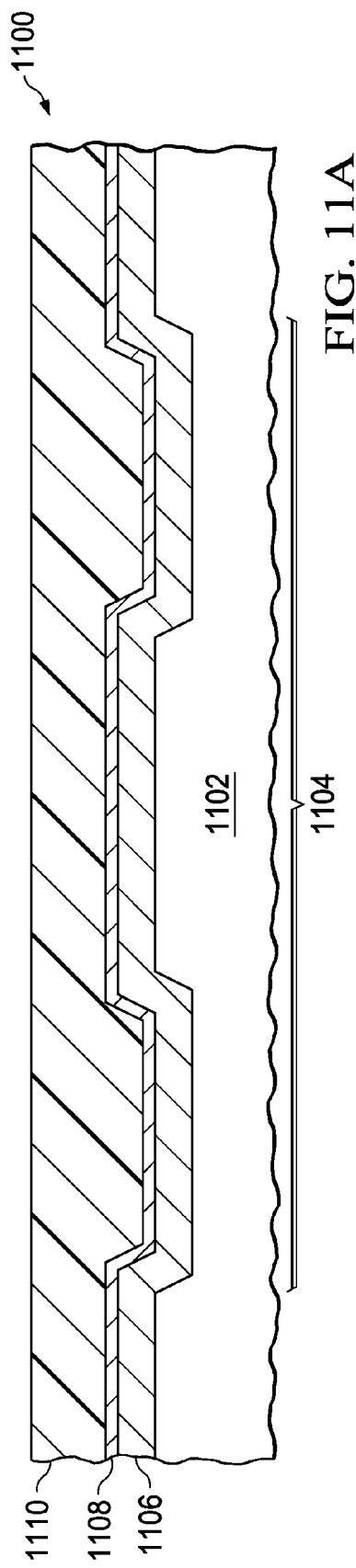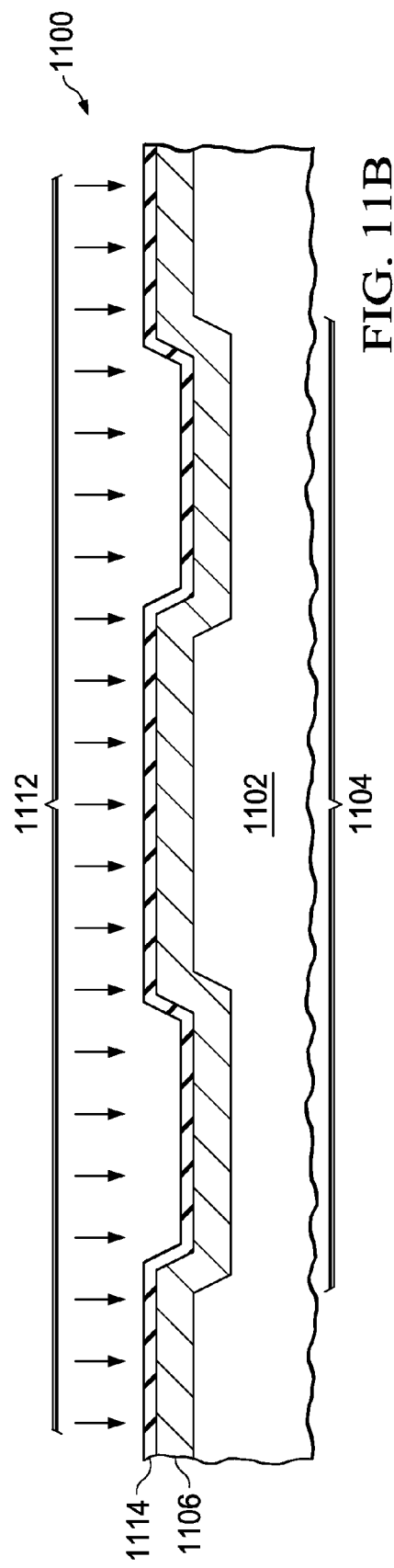

INCREASING EXPOSURE TOOL ALIGNMENT SIGNAL STRENGTH FOR A FERROELECTRIC CAPACITOR LAYER

FIELD OF THE INVENTION

This invention relates to the field of integrated circuits. More particularly, this invention relates to alignment of patterns in integrated circuits.

BACKGROUND OF THE INVENTION

Photolithographic patterns on an integrated circuit (IC) are often positioned with respect to existing structures in the IC using topographical alignment marks formed in existing patterned layers in the IC having surface height differences typically more than 10 nanometers with respect to adjacent regions of the IC or within the alignment marks. Light is reflected from the topographical alignment marks to measure the position of the IC. In some instances, a layer of material over the topographical alignment marks has low reflectivity, making measurement of the IC position problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides an improved alignment structure for photolithographic pattern alignment in which a reflective layer is formed over a completed topographical alignment mark which is under a low reflectivity layer. Topographical alignment marks have at least 10 nanometers of surface height difference within the alignment marks or between the alignment mark and adjacent regions. The low reflectivity layer may be formed during process steps subsequent to formation of the topographical alignment mark. The reflective layer may be one or more layers of a metal or dielectric. The reflective layer may be formed over an entire surface of an IC containing the topographical alignment mark, or may be confined to an area over the topographical alignment mark. The reflective layer may be removed during subsequent processing, or may remain in the completed IC. In a specific embodiment, a shiny layer of titanium aluminum (TiAl) is formed over a layer stack of one or more low reflectivity layers of titanium aluminum nitride (TiAlN) and/or titanium aluminum oxy-nitride (TiAlON), a first layer of iridium, a layer of lead zirconium titanate (PZT), a second layer of iridium and a layer of TiAlN to provide reflections from topographical alignment marks. In another specific embodiment, a reflective layer is formed over a low reflectivity layer of high electrical resistivity material such as silicon chromium (SiCr), nickel chromium (NiCr), or tantalum nitride (TaN) which is located over a completed topographical alignment mark. A process for fabricating an IC with the inventive alignment mark structure is also disclosed.

DESCRIPTION OF THE VIEWS OF THE DRAWING

FIG. 2A through FIG. 2C are cross-section of an IC depicting a method of forming a reflective layer according to an embodiment of the instant invention.

FIG. 3A and FIG. 3B are cross-sections of an IC depicting a method of forming a reflective layer according to an alternate embodiment of the instant invention.

FIG. 4A through FIG. 4C are cross-sections of an IC depicting formation of a reflective layer which includes more than one sub-layer according to an embodiment of the instant invention.

FIG. 5A and FIG. 5B are cross-sections of an IC depicting formation of a localized reflective layer according to an embodiment of the instant invention.

FIG. 6A and FIG. 6B are cross-sections of an IC depicting formation of a localized reflective layer according to another embodiment of the instant invention.

FIG. 7A and FIG. 7B are cross-sections of an IC depicting formation of a localized reflective layer according to a further embodiment of the instant invention.

FIG. 10A through FIG. 10D are cross-sections of an IC with a reflective layer including an etch stop sub-layer and a reflective sub-layer formed according to an embodiment of the instant invention, depicted in successive process operations.

FIG. 11A and FIG. 11B are cross-sections of an IC with a reflective layer which is converted to another chemical composition during a fabrication process sequence of the IC, according to an embodiment of the instant invention, depicted in successive process operations.

DETAILED DESCRIPTION

Figure 1A:
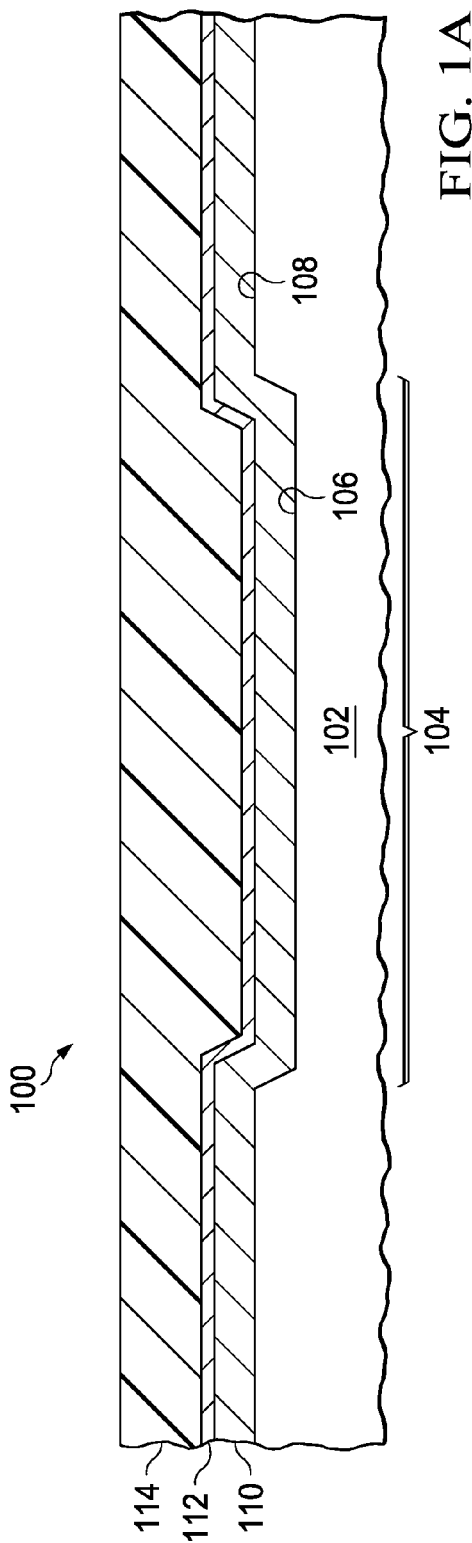
FIG. 1A and FIG. 1B are cross-sections of a first IC with an area-defined topographical alignment mark and a second IC with an edge-defined topographical alignment mark, covered with low reflectivity layers, with reflective layers formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this specification, the term "topographical alignment mark" is understood to refer to an alignment mark in an integrated circuit substrate with at least 10 nanometers height difference within the alignment mark or between the alignment mark and adjacent regions of the substrate.

The term "ferroelectric capacitor layer" is understood to refer to a layer of ferroelectric material such as lead zirconium titanate (PZT) which is suitable for formation of a capacitor with a permanently polarizable dielectric. A ferroelectric capacitor layer may include additional layers which are included in the capacitor, such as metal layers for forming plates of the capacitor.

Difficulty in aligning a photolithographic pattern to a topographical alignment mark in an integrated circuit (IC) covered with a layer with low reflectivity is addressed by the instant invention, which provides an improved alignment structure which includes a reflective layer formed atop the low reflectivity layer over the topographical alignment mark. The low reflectivity layer may be formed during processing subsequent to completion of the topographical alignment mark. The reflective layer may be one or more layers of a metal or dielectric. The reflective layer may be formed over an entire surface of the IC containing the topographical alignment mark, or may be confined to an area over the topographical alignment mark. The reflective layer may be removed during subsequent processing, or may remain in the completed IC. In a specific embodiment, a shiny layer of titanium aluminum (TiAl) is formed over a layer stack of one or more low reflectivity layers of titanium aluminum nitride (TiAlN) and/or titanium aluminum oxy-nitride (TiAlON, for example $TiAlO_{0.3}N_{0.7}$ or $TiAlO_{0.1}N_{0.9}$), a first layer of iridium, a layer of PZT, a second layer of iridium and a layer of titanium aluminum nitride (TiAlN) to provide reflections from topographical alignment marks with at least 10 nanometers of surface height difference. In another specific embodiment, a reflective layer is formed over a low reflectivity layer of high electrical resistivity material such as a thin film used for resistors.

Figure 1B:
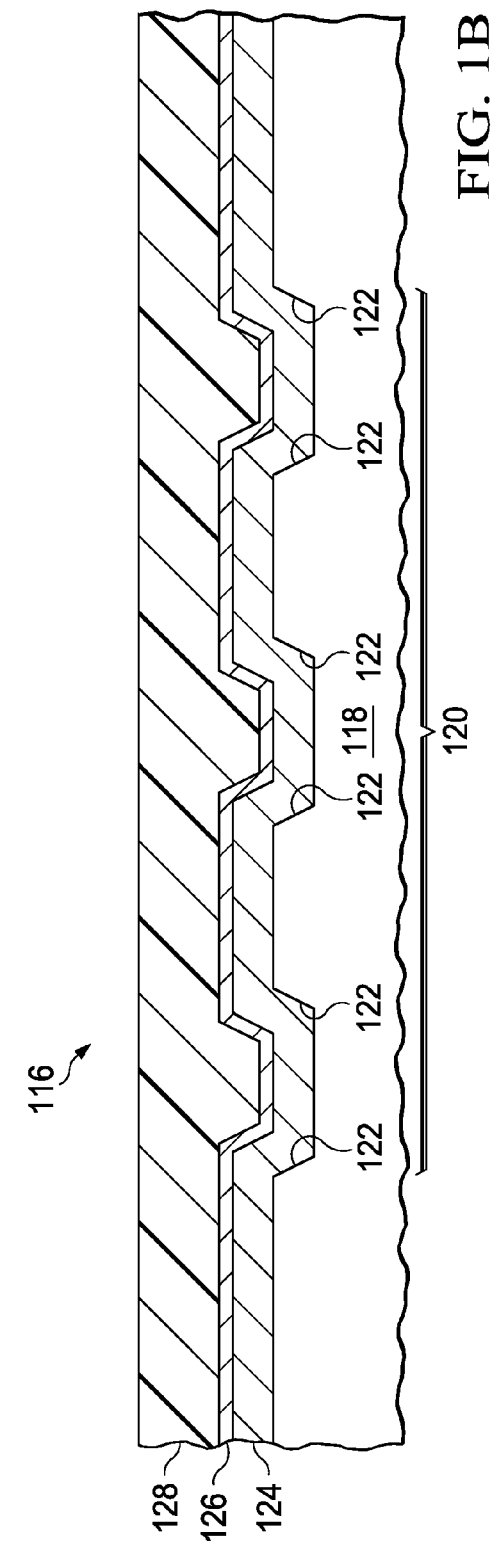

FIG. 1A and FIG. 1B are cross-sections of a first IC with an area-defined topographical alignment mark and a second IC with an edge-defined topographical alignment mark, covered with low reflectivity layers, with reflective layers formed according to an embodiment of the instant invention. Referring to FIG. 1A, the first IC (100) is formed in a substrate (102) which may include one or more layers. A completed area-defined topographical alignment mark (104) is formed in the substrate (102). A difference in surface height between a first surface (106) in the topographical alignment mark (104) and a second surface (108) outside the topographical alignment mark (104) is greater than 10 nanometers. A layer of material with low reflectivity (110) is subsequently formed on a top surface of the substrate (102), essentially replicating the difference in surface height between the first surface (106) and the second surface (108). The low reflectivity layer (110) may be used for forming components in the first IC (100). In one example, the low reflectivity layer (110) may be a layer stack of one or more low reflectivity layers of TiAlN and/or TiAlON, a first layer of iridium containing material, a layer of PZT, a second layer of iridium containing material, and a layer of TiAlN. In another example, the low reflectivity layer (110) may be a layer of high electrical resistivity material for thin film resistors, such as alloys of silicon chromium (SiCr), alloys of silicon chromium carbide (SiCrC), alloys of nickel chromium (NiCr), alloys of nickel chromium with oxygen (NiCrO), alloys of nickel chromium silicon aluminum (NiCrSiAl), tantalum nitride (TaN), tantalum oxynitride (TaON), alloys of titanium chromium aluminum oxide (TiCrAlO), molybdenum silicide ($MoSi_2$), ceramic metal materials such as chromium silicon oxide (Cr(SiO)) or silicon chromium oxide (Si(CrO)), or metal oxide materials such as ruthenium oxide (RuO) or lanthanum oxide (LaO). A reflective layer (112), with a reflectivity preferably greater than 25 percent at wavelengths used to measure a position of the IC (100), is formed on a top surface of the low reflectivity layer (110), essentially replicating the difference in surface height between the first surface (106) and the second surface (108).

The reflective layer (112) may have a metallic composition, for example, aluminum (Al), titanium (Ti), titanium aluminum (TiAl), titanium tungsten ($TiW_x$), titanium nitride (TiN), tantalum (Ta), tungsten (W) and/or copper (Cu), may be formed of one or more layers of inorganic dielectric material such as silicon dioxide, silicon nitride, silicon oxynitride, hafnium oxide, silicon carbide, and/or carbon doped silicon dioxide, or may be formed of one or more layers of organic material such as novolac resin, poly-methyl-methacrylate and/or phenolic resin. The reflective layer (112) may be formed of a metallic material, preferably with an organic component or possibly a graphitic component, in combination with an organic or inorganic dielectric material. The reflective layer (112) may have a high electrical resistivity or be electrically insulating. A layer of photoresist (114) is formed on a top surface of the reflective layer (112), for example by dispensing a mixture of photoresist and a solvent on a top surface of the reflective layer (112) and spinning the IC (100) about an axis perpendicular to a top surface of the IC (100) such that the photoresist is distributed across the top surface of the reflective layer (112). Typically, a top surface of the photoresist layer over the area-defined topographical alignment mark (104) is essentially planar, and does not replicate the difference in surface height between the first surface (106) and the second surface (108).

During alignment of a photolithographic pattern to the IC (100), light from a photolithographic pattern alignment instrument, commonly known as a printer, a stepper or a scanner, is advantageously reflected from the top surface of the reflective layer (112) in the area of the area-defined topographical alignment mark (104) and an area outside the topographical alignment mark (104), and detected by a sensor, possibly a person, enabling measurement of a position of the IC (100) with more accuracy than would be possible without the reflective layer (112).

Referring to FIG. 1B, the second IC (116) is formed in a substrate (118) which may include one or more layers. A completed edge-defined topographical alignment mark (120) is formed in the substrate (118) which contains steps (122), greater than 10 nanometers. A low reflectivity layer (124) is subsequently formed on a top surface of the substrate over the edge-defined topographical alignment mark (120), essentially replicating the steps (122) in the substrate (118). The low reflectivity layer (124) may be used for forming components in the second IC (116). A reflective layer (126), with the properties described in reference to FIG. 1A, is formed on a top surface of the low reflectivity layer (124) over the edge-defined topographical alignment mark (120), essentially replicating the steps (122) in the substrate (118). A photoresist layer (128) is formed on a top surface of the reflective layer (126) as described in reference to FIG. 1A, over the edge-defined topographical alignment mark (120). Typically, a top surface of the photoresist layer (128) is essentially planar over the edge-defined topographical alignment mark (120), and does not replicate the steps (122).

During alignment of a photolithographic pattern to the IC (116), light from a photolithographic pattern alignment instrument is advantageously reflected from the edges of the edge-defined topographical alignment mark (120) replicated in the reflective layer (126) and detected by a sensor, possibly a person, enabling measurement of a position of the IC (116) with more accuracy than would be possible without the reflective layer (126).

FIG. 2A through FIG. 2C are cross-section of an IC depicting a method of forming a reflective layer according to an embodiment of the instant invention. Referring to FIG. 2A, the IC (200) is formed in a substrate (202), which may include one or more layers. A topographical alignment mark (204) is formed in the substrate (202), such that a difference in height of a top surface of the substrate (202) across the topographical alignment mark (204) preferably exceeds 10 nanometers. A low reflectivity layer (206) is formed on the top surface of the substrate (202), essentially replicating the height difference of the top surface of the substrate (202) across the topographical alignment mark (204). A reflective precursor layer (208) such as polycrystalline silicon, commonly known as polysilicon, is formed on a top surface of the low reflectivity layer (206), essentially replicating the height difference of the top surface of the substrate (202) across the topographical alignment mark (204). The reflective precursor layer (208) may be a top layer of the low reflectivity layer (206).

Referring to FIG. 2B, the IC (200) is exposed to a plasma process, depicted schematically by (210), such as an oxygen containing plasma or a nitrogen containing plasma, which modifies a chemical composition of the reflective precursor layer to form a reflective layer (212) with the properties described in reference to FIG. 1A. For example, an oxygen containing plasma may oxidize the reflective precursor layer to convert the reflective precursor layer to a dielectric material with a desired reflectivity. Similarly, a nitrogen containing plasma may nitridate the reflective precursor layer to convert the reflective precursor layer to a metallic composition with a desired reflectivity.

Referring to FIG. 2C, a layer of photoresist (214) is formed on a top surface of the reflective layer (212). Typically, a top surface of the photoresist layer (214) is essentially planar over the topographical alignment mark (204), and does not replicate the height difference of the top surface of the substrate (202).

During alignment of a photolithographic pattern to the IC (200), light from a photolithographic pattern alignment instrument is advantageously reflected from the topographical alignment mark (204) replicated in the reflective layer (212) and detected by a sensor, possibly a person, enabling measurement of a position of the IC (200) with more accuracy than would be possible without the reflective layer (212). Formation of the reflective layer (212) according to the instant embodiment is furthermore advantageous because additional cost and complexity to a fabrication process sequence of the IC (200) is minimal.

Figure 3B:
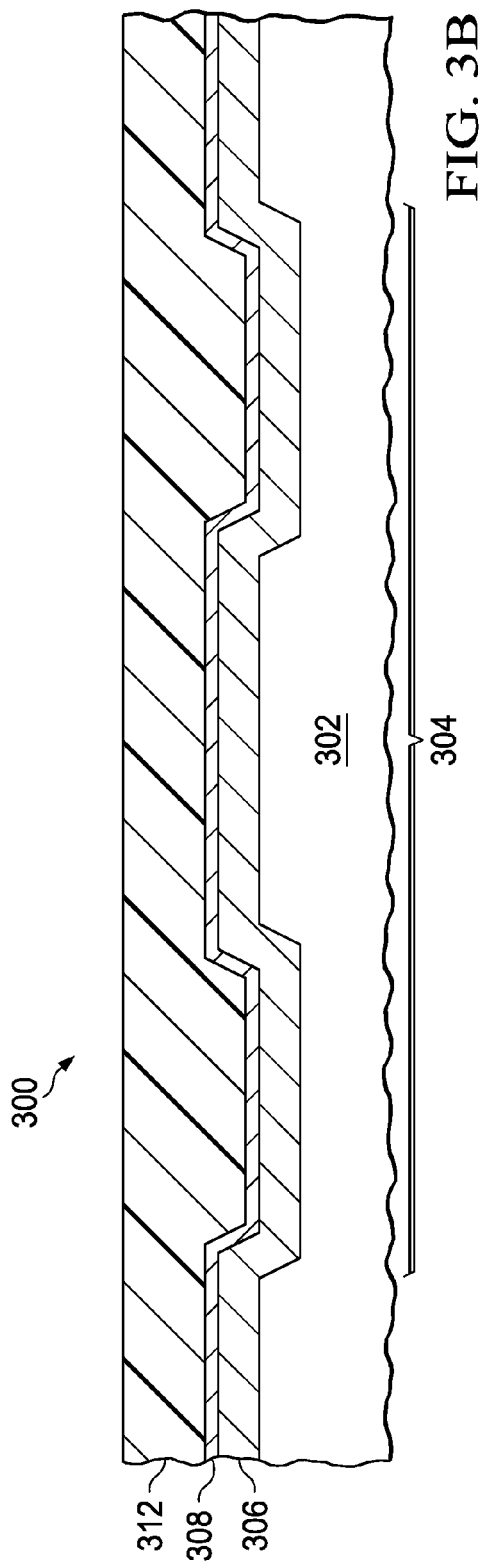

FIG. 3A and FIG. 3B are cross-sections of an IC depicting a method of forming a reflective layer according to an alternate embodiment of the instant invention. Referring to FIG. 3A, the IC (300) is formed in a substrate (302), which may include one or more layers. A topographical alignment mark (304) is formed in the substrate (302), such that a difference in height of a top surface of the substrate (302) across the topographical alignment mark (304) preferably exceeds 10 nanometers. A low reflectivity layer (306) is formed on the top surface of the substrate (302), essentially replicating the height difference of the top surface of the substrate (302) across the topographical alignment mark (304). A reflective layer (308), with the properties described in reference to FIG. 1A, is formed on a top surface of the low reflectivity layer (306), essentially replicating the height difference of the top surface of the substrate (302) across the topographical alignment mark (304). In the instant embodiment, the reflective layer (308) is preferably formed by depositing materials using physical vapor deposition (PVD) methods, chemical vapor deposition (CVD) methods, evaporation methods, plasma enhanced chemical vapor deposition (PECVD) methods, atomic layer deposition (ALD) methods, spin coating or other deposition method, depicted schematically in FIG. 3A as deposition process (310).

Referring to FIG. 3B, a layer of photoresist (312) is formed on a top surface of the reflective layer (308). Typically, a top surface of the photoresist layer (312) is essentially planar over the topographical alignment mark (304), and does not replicate the height difference of the top surface of the substrate (302).

During alignment of a photolithographic pattern to the IC (300), light from a photolithographic pattern alignment instrument is advantageously reflected from the topographical alignment mark (304) replicated in the reflective layer (308) and detected by a sensor, possibly a person, enabling measurement of a position of the IC (300) with more accuracy than would be possible without the reflective layer (308). Formation of the reflective layer (308) according to the instant embodiment is furthermore advantageous because optical properties of the reflective layer (308) may be optimized by selection of materials in the reflective layer (308) and selection of a deposition process for forming the reflective layer (308). For example, a thickness of the reflective layer (308) may be selected to form a half-wave reflection layer, in which the thickness of the reflective layer (308) is substantially equal to half a wavelength of light used by the photolithographic pattern to measure the position of the IC (300), divided by an index of refraction of the reflective layer (308).

Figure 4A:
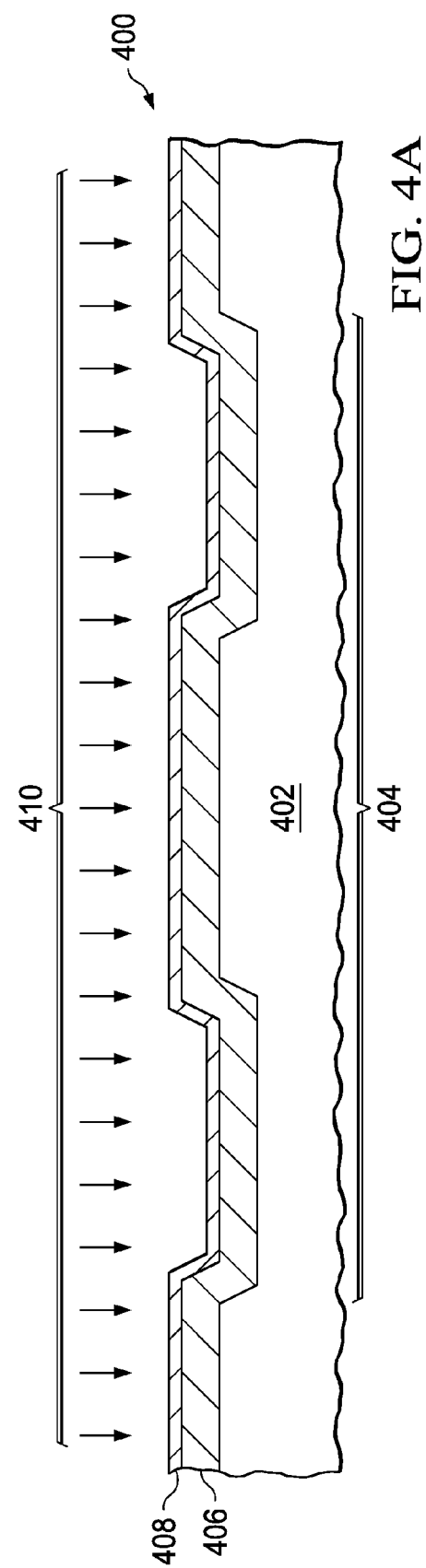

FIG. 4A through FIG. 4C are cross-sections of an IC depicting formation of a reflective layer which includes more than one sub-layer according to an embodiment of the instant invention. Referring to FIG. 4A, the IC (400) is formed in a substrate (402), which may include one or more layers. A topographical alignment mark (404) is formed in the substrate (402), such that a difference in height of a top surface of the substrate (402) across the topographical alignment mark (404) preferably exceeds 10 nanometers. A low reflectivity layer (406) is formed on the top surface of the substrate (402), essentially replicating the height difference of the top surface of the substrate (402) across the topographical alignment mark (404). A first sub-layer (408) of a reflective layer with the properties described in reference to FIG. 1A is formed on is formed on a top surface of the low reflectivity layer (406), essentially replicating the height difference of the top surface of the substrate (402) across the topographical alignment mark (404), preferably by a deposition process as described in reference to FIG. 3A, depicted schematically in FIG. 4A as a first deposition process (410).

Referring to FIG. 4B, a second sub-layer (412) is formed on is formed on a top surface of the first sub-layer (408), essentially replicating the height difference of the top surface of the substrate (402) across the topographical alignment mark (404), also preferably by a deposition process as described in reference to FIG. 3A, depicted schematically in FIG. 4B as a second deposition process (414). Additional sub-layers may be formed by similar processes to attain desired optical properties and compatibility with fabrication processes of the IC (400). The sub-layers may be metals, semiconductors, or dielectrics, or a combination of metals, semiconductors and dielectrics.

Referring to FIG. 4C, a layer of photoresist (416) is formed on a top surface of the reflective layer (418) which includes the first sublayer (408) and the second sub-layer (412). Typically, a top surface of the photoresist layer (416) is essentially planar over the topographical alignment mark (404), and does not replicate the height difference of the top surface of the substrate (402).

During alignment of a photolithographic pattern to the IC (400), light from a photolithographic pattern alignment instrument is advantageously reflected from the topographical alignment mark (404) replicated in the reflective layer (418) and detected by a sensor, possibly a person, enabling measurement of a position of the IC (400) with more accuracy than would be possible without the reflective layer (418). Formation of the reflective layer (418) in multiple sub-layers according to the instant embodiment is furthermore advantageous because optical properties of the reflective layer (418) may be optimized by selection of materials and thicknesses of the sub-layers. For example, a stack of quarter-wave sub-layers of alternating dielectric materials such as silicon dioxide and silicon nitride provides a reflective layer (418). A quarter-wave sub-layer has a thickness substantially equal to one-fourth of a wavelength of the light used by the photolithographic pattern alignment instrument, divided by an index of refraction of the sub-layer.

In some application using the inventive reflective layer, it may be advantageous to confine the reflective layer to an area above the appropriate topographical alignment mark, which will be referred to in this disclosure as a localized reflective layer. A reflective layer which exists over an entire surface of an IC may be referred to in this disclosure as a global reflective layer to assist an understanding of the embodiment being recited.

FIG. 5A and FIG. 5B are cross-sections of an IC depicting formation of a localized reflective layer according to an embodiment of the instant invention. Referring to FIG. 5A, the IC (500) is formed in a substrate (502), which may include one or more layers. A topographical alignment mark (504) is formed in the substrate (502), such that a difference in height of a top surface of the substrate (502) across the topographical alignment mark (504) preferably exceeds 10 nanometers. A low reflectivity layer (506) is formed on the top surface of the substrate (502), essentially replicating the height difference of the top surface of the substrate (502) across the topographical alignment mark (504). A global reflective layer (508) with the properties described in reference to FIG. 1A is formed on a top surface of the low reflectivity layer (506), essentially replicating the height difference of the top surface of the substrate (502) across the topographical alignment mark (504). A localized reflective layer photoresist pattern (510) is formed on a top surface of the global reflective layer (508) using known photolithographic methods to define an area for a localized reflective layer above the topographical alignment mark (504). Reflective layer material in the global reflective layer (508) outside the area for a localized reflective layer is removed by an etch process such as a reactive ion etch or ion mill process appropriate for the reflective layer material, depicted schematically in FIG. 5A by etch process (512).

Referring to FIG. 5B, substantially all the reflective layer material outside the area for a localized reflective layer has been removed, leaving a localized reflective layer (514) over the topographical alignment mark (504). The localized reflective layer photoresist pattern is removed, for example by exposing the IC (500) to an oxygen containing plasma, followed by a wet cleanup to remove any organic residue from an existing top surface of the IC (500). A layer of photoresist (516) is formed on an existing top surface of the IC (500). Typically, a top surface of the photoresist layer (516) is essentially planar over the topographical alignment mark (504), and does not replicate the height difference of the top surface of the substrate (502).

During alignment of a photolithographic pattern to the IC (500), light from a photolithographic pattern alignment instrument is advantageously reflected from the topographical alignment mark (504) replicated in the localized reflective layer (514) and detected by a sensor, possibly a person, enabling measurement of a position of the IC (500) with more accuracy than would be possible without the localized reflective layer (514). Confining the localized reflective layer (514) to an area above the topographical alignment mark (504) may be advantageous in some instances because the reflective layer material may produce adverse effects during subsequent fabrication steps of the IC (500) if left on the top surface of the low reflectivity layer (506) across the IC (500).

FIG. 6A and FIG. 6B are cross-sections of an IC depicting formation of a localized reflective layer according to another embodiment of the instant invention. Referring to FIG. 6A, the IC (600) is formed in a substrate (602), which may include one or more layers. A topographical alignment mark (604) is formed in the substrate (602), such that a difference in height of a top surface of the substrate (602) across the topographical alignment mark (604) preferably exceeds 10 nanometers. A low reflectivity layer (606) is formed on the top surface of the substrate (602), essentially replicating the height difference of the top surface of the substrate (602) across the topographical alignment mark (604). A shadow mask (608), which includes an opening in an area defined for a localized reflective layer, is positioned above the IC (600) so that the opening is above the area defined for the localized reflective layer. Reflective layer material is deposited, for example by a process discussed in reference to FIG. 3A, depicted schematically in FIG. 6A by deposition process (610), through the opening in the shadow mask (608) to form a localized reflective layer (612) on a top surface of the low reflectivity layer (606) over the topographical alignment mark (604), depicted as partially formed in FIG. 6A. Reflective layer material is blocked from areas outside the localized reflective layer area by solid regions of the shadow mask (608).

Referring to FIG. 6B, deposition of the reflective layer material has been completed, resulting in the completed localized reflective layer (612). A layer of photoresist (614) is formed on an existing top surface of the IC (600). Typically, a top surface of the photoresist layer (614) is essentially planar over the topographical alignment mark (604), and does not replicate the height difference of the top surface of the substrate (602).

During alignment of a photolithographic pattern to the IC (600), light from a photolithographic pattern alignment instrument is advantageously reflected from the topographical alignment mark (604) replicated in the localized reflective layer (614) and detected by a sensor, possibly a person, enabling measurement of a position of the IC (600) with more accuracy than would be possible without the localized reflective layer (612). Confining the localized reflective layer (612) to an area above the topographical alignment mark (604) accrues the advantages discussed in reference to FIG. 5A and FIG. 5B. The method of forming the localized reflective layer (612) using the shadow mask (608) may provide further advantages by eliminating a photolithographic step and an etch step from a fabrication process sequence of the IC (600).

FIG. 7A and FIG. 7B are cross-sections of an IC depicting formation of a localized reflective layer according to a further embodiment of the instant invention. Referring to FIG. 7A, the IC (700) is formed in a substrate (702), which may include one or more layers. A topographical alignment mark (704) is formed in the substrate (702), such that a difference in height of a top surface of the substrate (702) across the topographical alignment mark (704) preferably exceeds 10 nanometers. A low reflectivity layer (706) is formed on the top surface of the substrate (702), essentially replicating the height difference of the top surface of the substrate (702) across the topographical alignment mark (704). Reflective layer material (708) is dispensed or emitted from a dispensing apparatus, for example a miniature dispenser similar to an inkjet droplet dispenser or a laser assisted metal-organic chemical vapor deposition (MOCVD) system, depicted in FIG. 7A as dispensing tip (710), and adheres to a top surface of the low reflectivity layer (706) in an area over the topographical alignment mark (704) to form a localized reflective layer (712). In one embodiment, the reflective layer material (708) from the dispensing tip (710) covers the area for the localized reflective layer (712) while the dispensing tip (710) remains stationary with respect to the IC (700). In another embodiment, the dispensing tip (710) may be moved laterally over the IC (700), as depicted in FIG. 7A by translation arrows (714), to cover the area for the localized reflective layer (712). In yet another embodiment, the IC (700) may be moved laterally under the dispensing tip (710) to cover the area for the localized reflective layer (712). An area for a localized reflective layer may be varied from IC to IC by reprogramming the dispensing apparatus.

Referring to FIG. 7B, deposition of the reflective layer material has been completed, resulting in the completed localized reflective layer (712). A layer of photoresist (716) is formed on an existing top surface of the IC (700). Typically, a top surface of the photoresist layer (716) is essentially planar over the topographical alignment mark (704), and does not replicate the height difference of the top surface of the substrate (702).

During alignment of a photolithographic pattern to the IC (700), light from a photolithographic pattern alignment instrument is advantageously reflected from the topographical alignment mark (704) replicated in the localized reflective layer (712) and detected by a sensor, possibly a person, enabling measurement of a position of the IC (700) with more accuracy than would be possible without the localized reflective layer (712). Confining the localized reflective layer (712) to an area above the topographical alignment mark (704) accrues the advantages discussed in reference to FIG. 5A and FIG. 5B. The method of forming the localized reflective layer (712) using the dispensing apparatus (710) may be further advantageous by providing flexibility in establishing an area for the localized reflective layer (712) on the IC (700).

Figure 8:
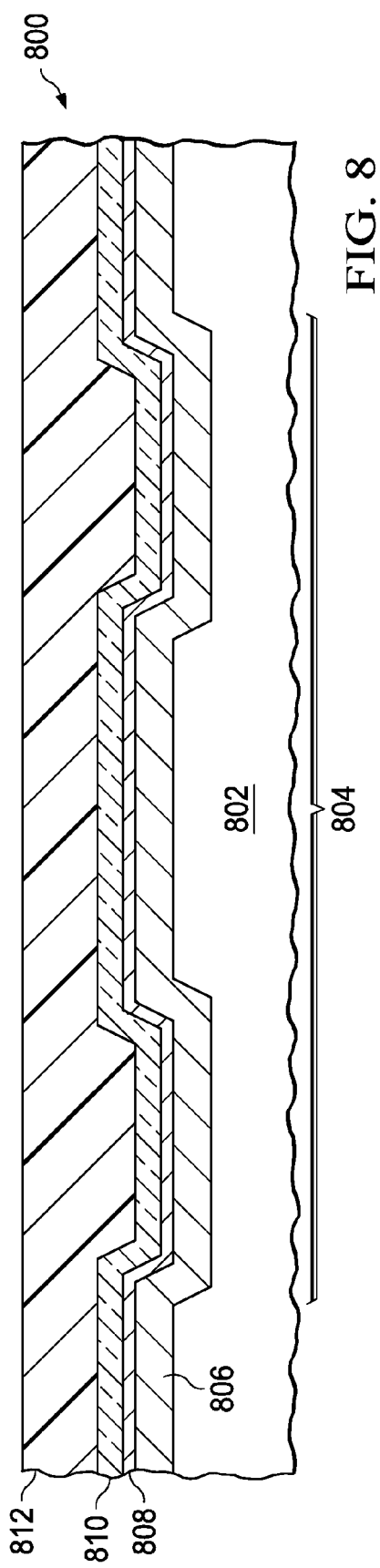
FIG. 8 is a cross-section of an IC with a reflective layer configured according to one embodiment of the instant invention.

Different embodiments of the instant invention may have the reflective layer at different positions relative to a low reflectivity layer and a photoresist layer to be patterned. FIG. 8 is a cross-section of an IC with a reflective layer configured according to one embodiment of the instant invention. The IC (800) is formed in a substrate (802), which may include one or more layers. A topographical alignment mark (804) is formed in the substrate (802), such that a difference in height of a top surface of the substrate (802) across the topographical alignment mark (804) preferably exceeds 10 nanometers. A low reflectivity layer (806) is formed on the top surface of the substrate (802), essentially replicating the height difference of the top surface of the substrate (802) across the topographical alignment mark (804). A reflective layer (808) with the properties described in reference to FIG. 1A is formed on a top surface of the low reflectivity layer (806) by any of the methods discussed herein. Furthermore, the reflective layer (808) may be a global reflective layer as depicted in FIG. 8 or a local reflective layer.

Continuing to refer to FIG. 8, a transparent layer (810), possibly of inorganic material such as silicon dioxide or silicon nitride, or of organic material such as poly methyl methacrylate, is formed on a top surface of the reflective layer (808). The transparent layer (810) may substantially or partially replicate any topography in the top surface of the reflective layer (808) or may provide a substantially planarized top surface. A layer of photoresist (812) is formed on a top surface of the transparent layer (810).

During alignment of a photolithographic pattern to the IC (800), light from a photolithographic pattern alignment instrument is advantageously reflected from the topographical alignment mark (804) replicated in the reflective layer (808) and detected by a sensor, possibly a person, enabling measurement of a position of the IC (800) with more accuracy than would be possible without the reflective layer (808). The transparent layer (810) may provide a desired protect barrier for the reflective layer (808) during subsequent processing of the IC (800). The transparent layer (810) may also provide a desired partially or substantially planarizing top surface which may advantageously reduce thickness variations in the photoresist layer (812).

Figure 9:
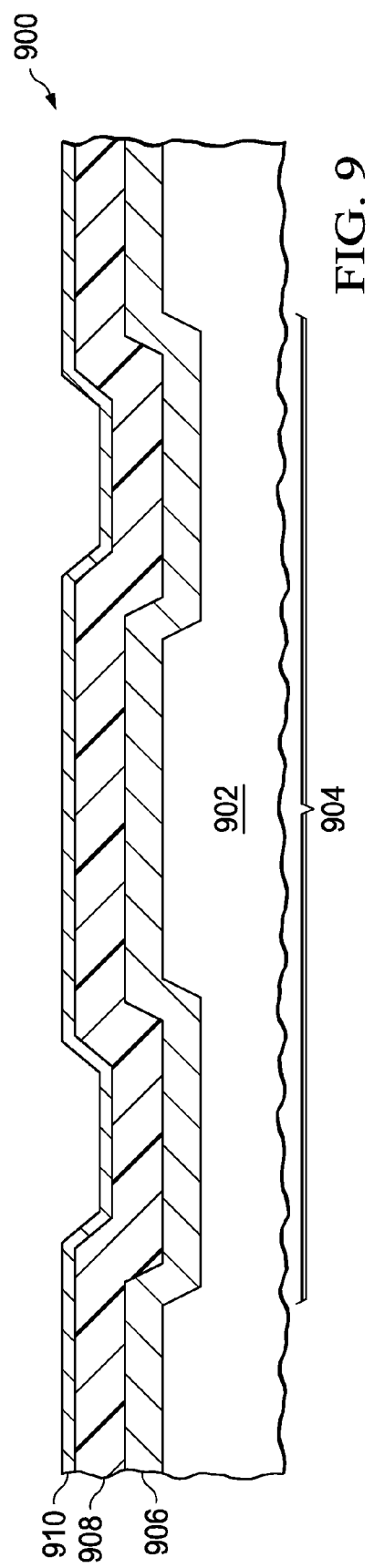
FIG. 9 is a cross-section of an IC with a reflective layer configured according to an alternate embodiment of the instant invention.

FIG. 9 is a cross-section of an IC with a reflective layer configured according to an alternate embodiment of the instant invention. The IC (900) is formed in a substrate (902), which may include one or more layers. A topographical alignment mark (904) is formed in the substrate (902), such that a difference in height of a top surface of the substrate (902) across the topographical alignment mark (904) preferably exceeds 10 nanometers. A low reflectivity layer (906) is formed on the top surface of the substrate (902), essentially replicating the height difference of the top surface of the substrate (902) across the topographical alignment mark (904). A conformal layer of photoresist (908) is formed on a top surface of the low reflectivity layer (906), possibly by dispensing a dilute mixture of photoresist and a solvent onto the top surface of the low reflectivity layer (906), spinning the IC to distribute the mixture, followed by baking to remove most of the solvent, or possibly by vapor phase deposition. The conformal layer of photoresist (908) replicates the height difference of the top surface of the substrate (902) across the topographical alignment mark (904) sufficiently to provide a difference in height of a top surface of the conformal photoresist layer (908) across the topographical alignment mark (904) which preferably exceeds 10 nanometers.

Continuing to refer to FIG. 9, a reflective layer (910) is formed on a top surface of the conformal photoresist layer (908). In a preferred embodiment, the reflective layer (910) has a reflectivity greater than 25 percent at the wavelengths used to measure a position of the IC (900) and a transmission greater than 50 percent at the wavelengths used to expose the conformal photoresist layer (908). For example, deposition of a thin layer of metal, possibly less than 20 nanometers thick, by evaporation may provide a reflective layer with the desired reflection and transmission properties.

During alignment of a photolithographic pattern to the IC (900), light from a photolithographic pattern alignment instrument is advantageously reflected from the topographical alignment mark (904) replicated in the reflective layer (910) and detected by a sensor, possibly a person, enabling measurement of a position of the IC (900) with more accuracy than would be possible without the reflective layer (910). Forming the reflective layer (910) on a top surface of the conformal photoresist layer (908) may advantageously facilitate removal of the reflective layer (910) concurrently with removal of the photoresist layer (908).

After a reflective layer has been used to align a photolithographic pattern to an IC, the reflective layer may be left on the IC, may be removed from the IC, or may be converted to a more desirable material composition.

FIG. 10A through FIG. 10D are cross-sections of an IC with a reflective layer including an etch stop sub-layer and a reflective sub-layer formed according to an embodiment of the instant invention, depicted in successive process operations. The IC (1000) is formed in a substrate (1002), which may include one or more layers. A topographical alignment mark (1004) is formed in the substrate (1002), such that a difference in height of a top surface of the substrate (1002) across the topographical alignment mark (1004) preferably exceeds 10 nanometers. A low reflectivity layer (1006) is formed on the top surface of the substrate (1002), essentially replicating the height difference of the top surface of the substrate (1002) across the topographical alignment mark (1004). An etch stop sub-layer (1008), possibly silicon dioxide, silicon nitride, silicon oxynitride or silicon carbide, is formed on a top surface of the low reflectivity layer (1006), essentially replicating the height difference of the top surface of the substrate (1002) across the topographical alignment mark (1004). A reflective sub-layer (1010) with the properties described in reference to FIG. 1A is formed on a top surface of the etch stop sub-layer (1008), essentially replicating the height difference of the top surface of the substrate (1002) across the topographical alignment mark (1004). A layer of photoresist (1012) is formed on a top surface of the reflective sub-layer (1010). During alignment of a photolithographic pattern to the IC (1000), light from a photolithographic pattern alignment instrument is advantageously reflected from the topographical alignment mark (1004) replicated in the reflective sub-layer (1010) and detected by a sensor, possibly a person, enabling measurement of a position of the IC (1000) with more accuracy than would be possible without the reflective sub-layer (1010). The photoresist layer (1012) is removed during subsequent processing, for example by exposing the IC (1000) to an oxygen containing plasma, followed by a wet cleanup to remove any organic residue from the top surface of the reflective layer (1010).

Referring to FIG. 10B, a reflective sub-layer etch process (1014), possibly a plasma in a reactive ion etch (RIE) tool or immersion in an etchant solution, removes the reflective sub-layer (1010), and preferably removes less than half the etch stop sub-layer (1008). In a preferred embodiment, reactive species of the reflective sub-layer etch process and material for the etch stop layer (1008) are selected to provide a desired etch selectivity between the reflective sub-layer (1010) and the etch stop sub-layer (1008).

Referring to FIG. 10C, the etch stop sub-layer may be removed by an optional etch stop removal process (1016), which preferably removes substantially all the etch stop sub-layer (1008) while removing substantially no material from the low reflectivity layer (1006).

FIG. 10D depicts the IC (1000) after optional removal of the etch stop sub-layer.

Formation of the etch stop sub-layer under the reflective layer advantageously facilitates removal of the reflective sub-layer to reduce adverse effects from reflective sub-layer material on a surface of the IC (1000) during subsequent processing.

FIG. 11A and FIG. 11B are cross-sections of an IC with a reflective layer which is converted to another chemical composition during a fabrication process sequence of the IC, according to an embodiment of the instant invention, depicted in successive process operations. The IC (1100) is formed in a substrate (1102), which may include one or more layers. A topographical alignment mark (1104) is formed in the substrate (1102), such that a difference in height of a top surface of the substrate (1102) across the topographical alignment mark (1104) preferably exceeds 10 nanometers. A low reflectivity layer (1106) is formed on the top surface of the substrate (1102), essentially replicating the height difference of the top surface of the substrate (1102) across the topographical alignment mark (1104). A reflective layer (1108) with the properties described in reference to FIG. 1A is formed on a top surface of the low reflectivity layer (1106), essentially repli- cating the height difference of the top surface of the substrate (1102) across the topographical alignment mark (1104). A layer of photoresist (1110) is formed on a top surface of the reflective layer (1108). During alignment of a photolithographic pattern to the IC (1100), light from a photolithographic pattern alignment instrument is advantageously reflected from the topographical alignment mark (1104) replicated in the reflective layer (1108) and detected by a sensor, possibly a person, enabling measurement of a position of the IC (1100) with more accuracy than would be possible without the reflective layer (1108). The photoresist layer (1010) is removed during subsequent processing, for example by exposing the IC (1100) to an oxygen containing plasma, followed by a wet cleanup to remove any organic residue from the top surface of the reflective layer (1108).

Referring to FIG. 11B, material in the reflective layer is converted by a conversion process (1112), such as an oxidizing plasma or an oxidizing aqueous solution, to a chemical composition which is more compatible with subsequent process operations in a fabrication process sequence of the IC (1100) to form a converted layer (1114). For example, an aluminum reflective layer may be converted by an oxidizing plasma to aluminum oxide. Conversion of material in the reflective layer to another chemical composition may provide an advantageous alternative to removing the reflective layer or leaving the reflective layer in place.

What is claimed is:

1. An integrated circuit, comprising:
 a photolithographic topographical alignment mark formed in a substrate;
 a low reflectivity layer formed on a top surface of said topographical alignment mark; said low reflectivity layer being a layer stack that includes a layer of titanium aluminum nitride (TiAlN), a layer of titanium aluminum oxynitride (TiAlON), a first sub-layer of iridium containing material, a layer of lead zirconium titanate (PZT), a second layer of iridium containing material, and a layer of TiAlN;
 a reflective layer that includes titanium aluminum (TiAl) formed on a top surface of said low reflectivity layer, in which:
  a top surface of said reflective layer duplicates a height difference across said topographical alignment mark; and
  a reflectivity of said reflective layer is greater than 25 percent at a wavelength used for positional measurement; and
 a photoresist layer formed in contact with a top surface of said reflective layer.

2. The integrated circuit of claim 1, in which said reflective layer further includes a plurality of sub-layers of different chemical compositions.

3. The integrated circuit of claim 2, in which said sub-layers include dielectric materials.

4. The integrated circuit of claim 1, in which said reflective layer is confined to an area above said topographical alignment mark.

5. An integrated circuit, comprising:
 a photolithographic topographical alignment mark formed in a substrate;
 a low reflectivity layer formed on a top surface of said topographical alignment mark; said low reflectivity layer being a layer stack that includes a layer of titanium aluminum nitride (TiAlN), a layer of titanium aluminum oxynitride (TiAlON), a first sub-layer of iridium containing material, a layer of lead zirconium titanate (PZT), a second layer of iridium containing material, and a layer of TiAlN;

a reflective layer that includes titanium aluminum (TiAl) formed on a top surface of said low reflectivity layer, in which:
- a top surface of said reflective layer duplicates a height difference across said topographical alignment mark; and
- a reflectivity of said reflective layer is greater than 25 percent at a wavelength used for positional measurement;

a transparent layer formed on a top surface of said reflective layer; and a photoresist layer formed in contact with a top surface of said transparent layer.

6. The integrated circuit of claim 5, in which said reflective layer further includes a plurality of sub-layers of different chemical compositions.

7. The integrated circuit of claim 6, in which said sub-layers include dielectric materials.

8. The integrated circuit of claim 5, in which said reflective layer is confined to an area above said topographical alignment mark.

* * * * *